United States Patent
Yeh et al.

(10) Patent No.: US 7,883,349 B2
(45) Date of Patent: Feb. 8, 2011

(54) SOCKET CONNECTOR HAVING METALLIC POSITIONING MEMBER SECURING ELECTRONIC DEVICE THEREIN

(75) Inventors: Cheng-Chi Yeh, Tu-Cheng (TW); Nan-Hung Lin, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/645,261

(22) Filed: Dec. 22, 2009

(65) Prior Publication Data

US 2010/0159732 A1    Jun. 24, 2010

(30) Foreign Application Priority Data

Dec. 22, 2008    (TW) .............................. 97222965 U

(51) Int. Cl.
*H01R 13/62* (2006.01)

(52) U.S. Cl. ..................................................... 439/325

(58) Field of Classification Search ................. 439/325, 439/327, 331, 333, 73, 347, 352, 378
See application file for complete search history.

(56) References Cited

U.S. PATENT DOCUMENTS

| | | | |
|---|---|---|---|
| 4,547,031 A * | 10/1985 | Korsunsky | 439/325 |
| 6,802,728 B1 | 10/2004 | Howell et al. | |
| 6,908,316 B2 | 6/2005 | Ma et al. | |
| 6,918,779 B2 * | 7/2005 | Liao | 439/342 |
| 6,945,794 B1 * | 9/2005 | Yang et al. | 439/73 |
| 7,553,178 B1 * | 6/2009 | Wertz et al. | 439/331 |

* cited by examiner

*Primary Examiner*—Chandrika Prasad
(74) *Attorney, Agent, or Firm*—Andrew C. Cheng; Wei Te Chung; Ming Chieh Chang

(57) ABSTRACT

A socket connector for receiving an electronic device includes an insulative housing with sidewalls extending upwardly and a plurality of contacts retained in the insulative housing. The sidewalls define a receiving space for the electronic device. At least one side wall is provided with a protrusion. An elastic positioning member is mounted within the protrusion and has an engaging section extending into the receiving space.

20 Claims, 5 Drawing Sheets

SOCKET CONNECTOR HAVING METALLIC POSITIONING MEMBER SECURING ELECTRONIC DEVICE THEREIN

BACKGROUND OF THE INVENTION

1. Field of the Invention

The present invention relates to a socket connector, and more particularly to a socket connector having metallic positioning members for positioning an electronic device, as well as securing the electronic device therein.

2. Description of Prior Art

U.S. Pat. No. 6,908,316 issued to Hao-Yun Ma on Jun. 21, 2005 discloses a socket connector for receiving an electronic device. The connector according to Ma includes an insulative housing with a plurality of terminals received therein. The electronic device is placed upon the housing and then comes to contact with the terminals so as to make electrical connection with the connector. The housing has four sidewalls each formed with at least one hard protrusion integrally extended therefrom. When the electronic device is disposed into the housing, the protrusions may abut against edges of the electronic device so that the electronic device is constrained in the housing.

However, the protrusion of the housing is made from plastic material without elasticity. So it is nearly impossible for the protrusion to be fitly engaged with the electronic device, which is likely to result either a gap or an interference therebetween. Consequently, the electronic device is either disposed without reliable retention or damaged by the interference with the hard protrusion.

To overcome above problem, another U.S. Pat. No. 6,802,728 issued to Howell on Oct. 12, 2004 discloses a socket connector which includes an insulative housing for accommodating an electronic device. The insulative housing has four sidewalls, two of which are respectively formed with a push finger. The push finger extends integrally from the sidewall of the insulative housing and has a pushing section at a free end thereof. When the electronic device is put onto the insulative housing, the push finger deforms and the pushing section abuts against the electronic device so that the electronic device is reliably retained in the insulative housing.

However, the plastic material of the push finger can not achieve robust intension. In addition, to meet the request of sufficient elasticity, the push finger is configured with a large length. Correspondingly, the productivity of the insulative housing is relatively bad.

SUMMARY OF THE INVENTION

It is therefore the object of the present invention to provide a socket connector having a robust positioning member capable of providing retention force.

In accordance with the present invention, a socket connector for receiving an electronic device is provided, which includes an insulative housing with sidewalls extending upwardly and a plurality of contacts retained in the insulative housing. The sidewalls define a receiving space for the electronic device. At least one sidewall is provided with a protrusion. An elastic positioning member is mounted within the protrusion and has an engaging section extending into the receiving space.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
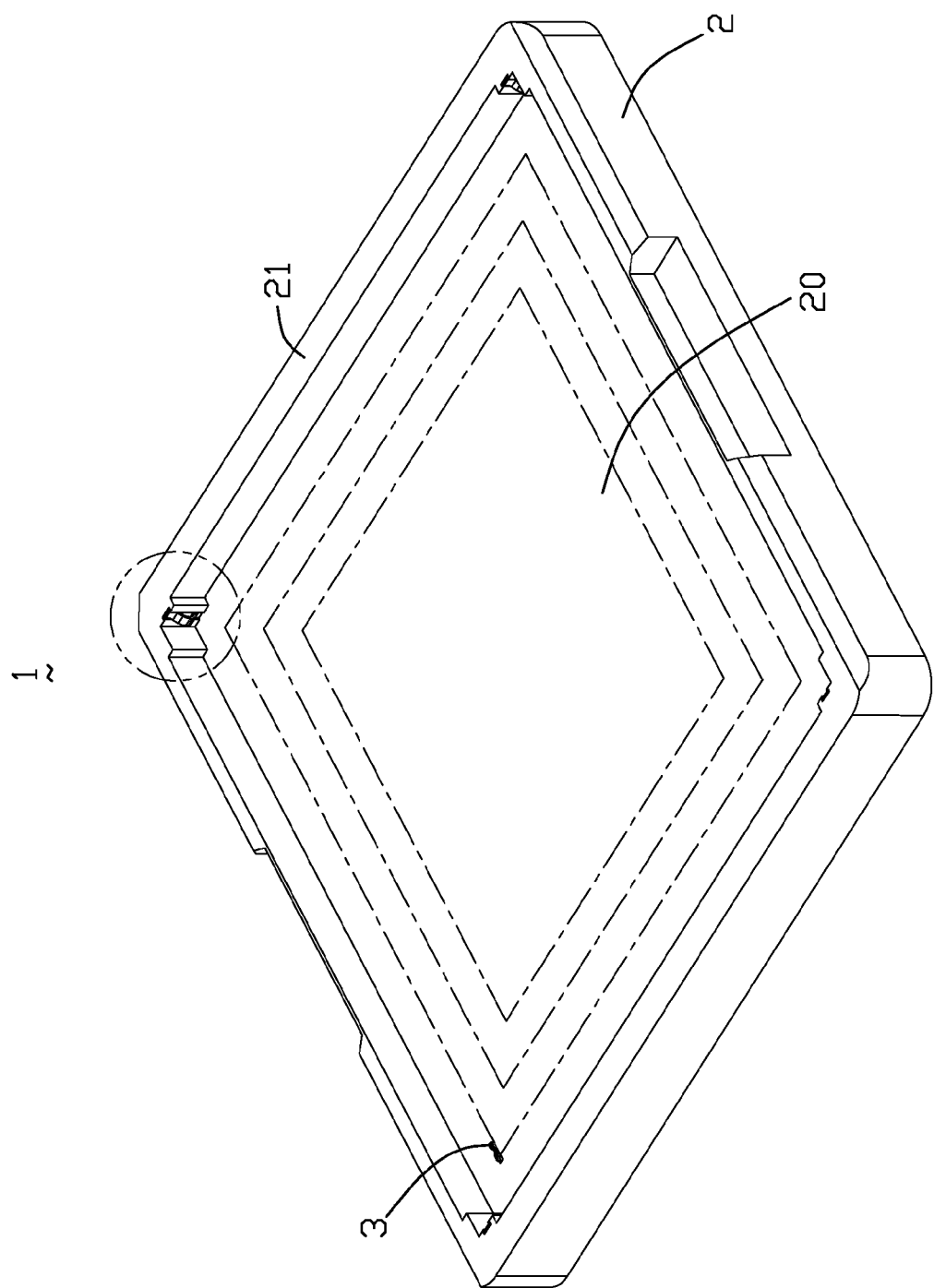
FIG. 1 is an assembled, perspective view of a socket connector in accordance with a preferred embodiment of the present invention.
Figure 4:
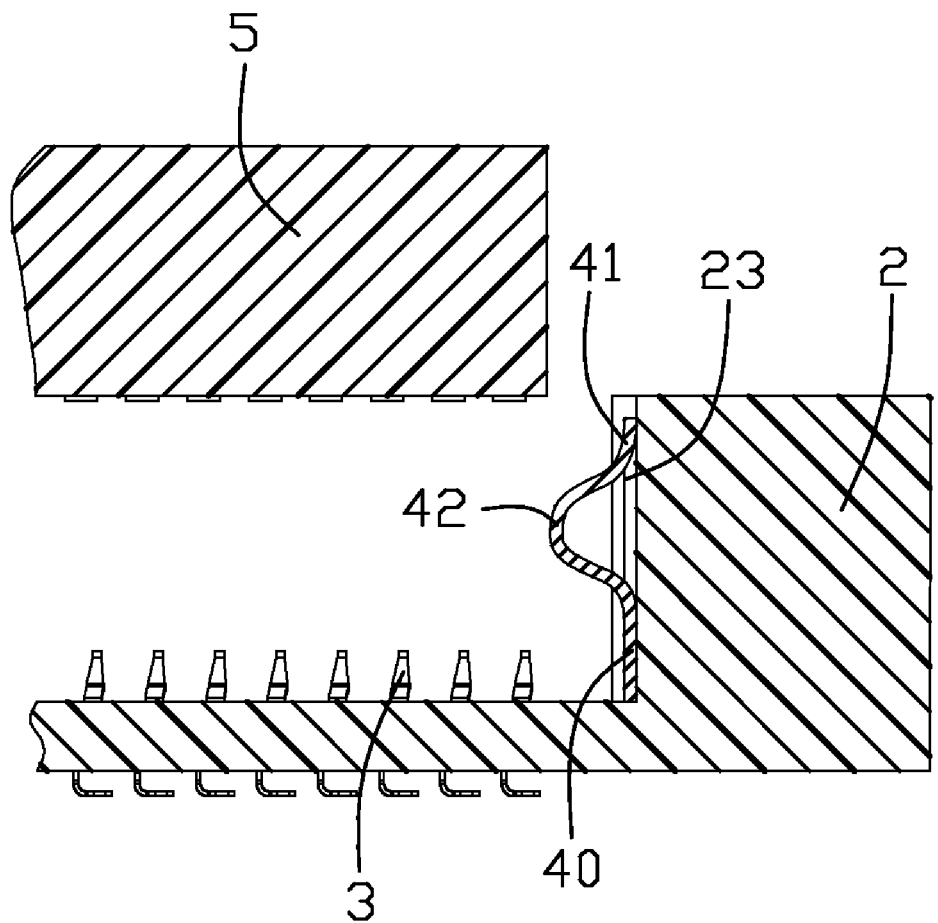
FIG. 4 is a cross sectional view showing a positioning member attached in an insulative housing.

The socket connector made in accordance with the present invention is generally mounted onto a printed circuit board (not shown). Referring to FIG. 1 and FIG. 4, the socket connector 1 includes an insulative housing 2 and a plurality of contacts 3 retained in the insulative housing 2. The insulative housing 2 further includes a base 20 and four sidewalls 21 extending upwardly from the base 20. The sidewalls 21 jointly define a receiving space (not labeled) for receiving an electronic device 5.

Figure 2:
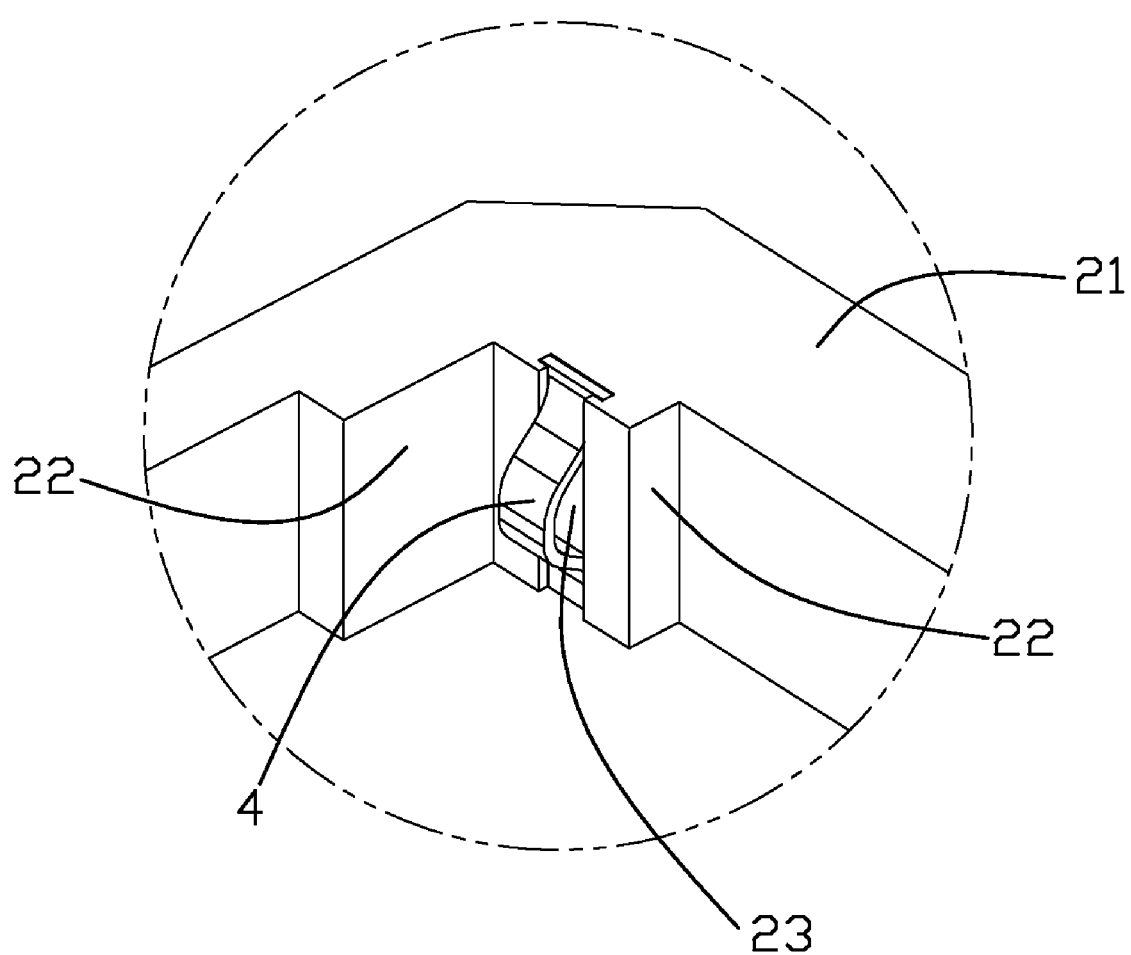
FIG. 2 is an enlarged view of the section labeled by a circle line in FIG. 1.
Figure 3:
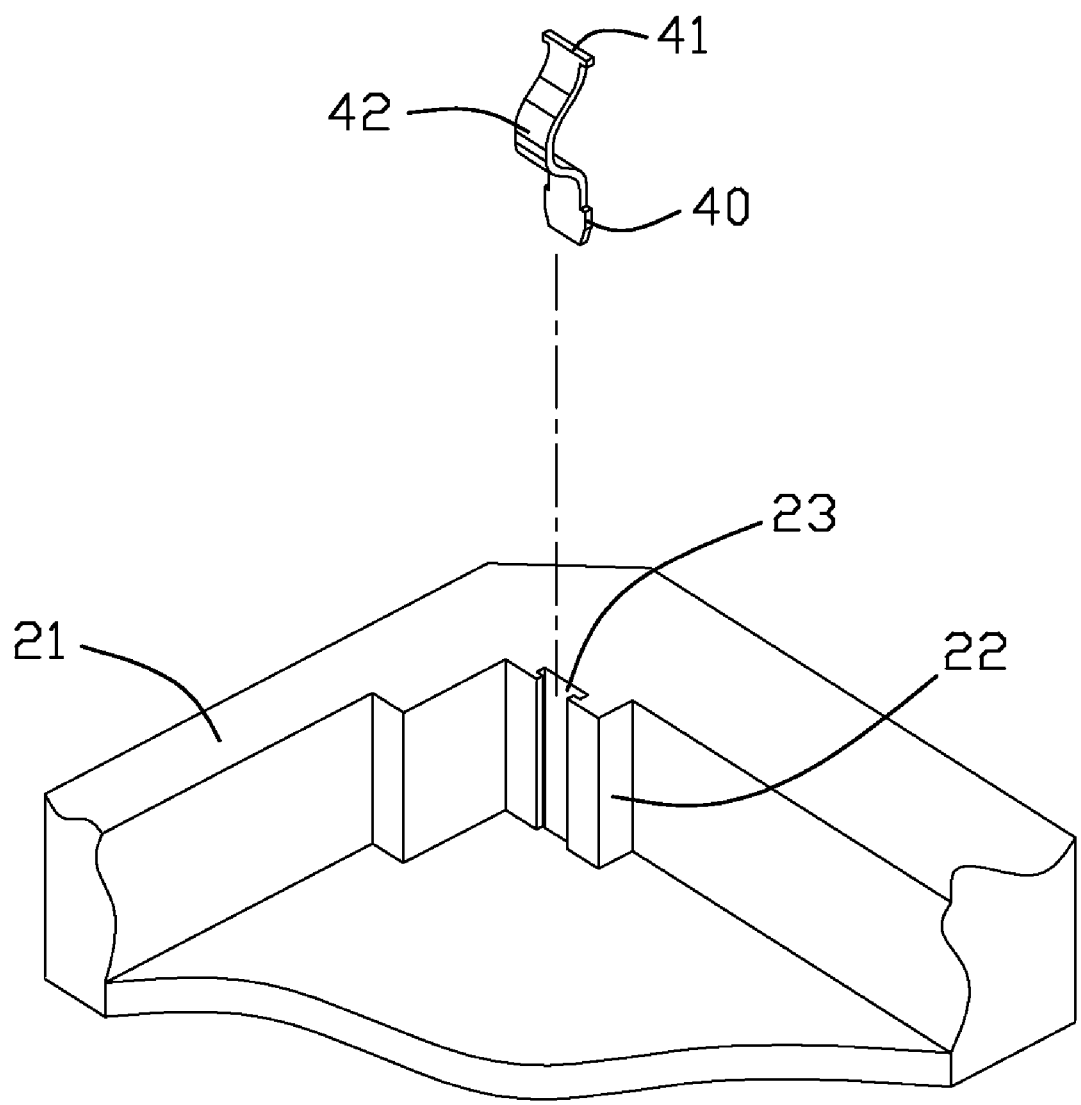
FIG. 3 is an exploded, perspective view of the socket connector in accordance with the preferred embodiment of the present invention.
Figure 5:
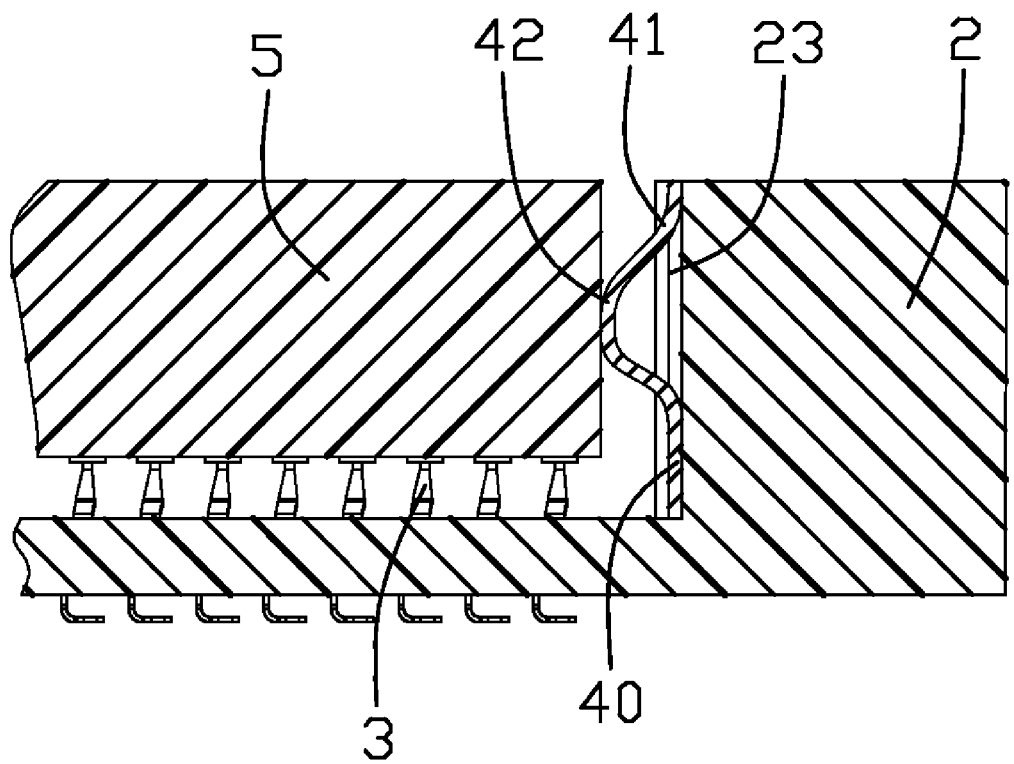
FIG. 5 is a cross sectional view showing the engagement between the positioning member and an electronic device.

Referring to FIG. 2 and FIG. 5, each sidewall 21 has two protrusions 22 respectively located at two ends thereof. The protrusions 22 from neighboring sidewalls 21 are connected to each other at a corner of the insulative housing 2. The protrusion 22 can serve as a datum for determining the pitch of the contact terminals such that when an IC socket is disposed therein, electrical interconnection between the contacts 3 and conductive pads of the electronic package 5 is ensured. At least one protrusion 22 has a slot 23 configured to communicate with the receiving space. A metallic and elastic positioning member 4 is inserted into and secured in the slot 23 and extends in a vertical direction. The positioning member 4 includes a lower end serving as a retaining section 40, an upper end serving as a lead-in section 41, and an engaging section 42 between the upper end 41 and the lower end 40. The lower end 40 of the positioning member 4 is securely retained in the slot 23, while the upper end 41 is moveably disposed in the slot 23 in responsive to an inserted electronic device 5. The engaging section 42 extends out of the slot 23 and protrudes into the receiving space. Particularly referring to FIG. 5, when the electronic device 5 is put into the receiving space and engaged with the positioning member 4, the engaging section 42 abuts against the electronic device 5 and is pushed outwardly in responsive to the inserted electronic device 5, and thereby providing the electronic device with a certain retention force. The upper end 41 of the positioning member 4 moves upwardly in the slot 23 when the positioning member 4 deforms. When the electronic device 5 is taken out of the insulative housing 2, the positioning member 4 retrieves to its original state and the upper end 41 moves downwardly along the slot 23. Understandably, the positioning member 4 performs a simple-support-beam effect, i.e., one fixed end and one slidable support end, with regard to the housing 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector for receiving an electronic device, comprising:
   an insulative housing with sidewalls extending upwardly and defining a receiving space for the electronic device, at least one side wall being provided with a protrusion;
   a plurality of contacts retained in the insulative housing; and
   an elastic positioning member mounted within the protrusion and having an engaging section extending into the receiving space.

2. The socket connector as claimed in claim 1, wherein the protrusion has a slot and the positioning member is inserted into and secured in the slot.

3. The socket connector as claimed in claim 2, wherein the positioning member has two opposite ends disposed in the slot, while the engaging section is extending out of the slot.

4. The socket connector as claimed in claim 3, wherein one of the ends of the positioning member is securely retained in the slot and the other end is moveably disposed in the slot.

5. The socket connector as claimed in claim 4, wherein the engaging section is substantially featured with an arc shape.

6. The socket connector as claimed in claim 5, wherein each sidewall is provided with two said protrusions respectively located at one end thereof, the protrusions from neighboring sidewalls being connected to each other.

7. The socket connector as claimed in claim 1, wherein the positioning member extends in a vertical direction.

8. A socket connector for receiving an electronic device, comprising:
   an insulative housing with sidewalls extending upwardly and defining a receiving space for the electronic device;
   a plurality of contacts retained in the insulative housing; and
   a metallic positioning member attached to the sidewall and deforms when the electronic device is put into the receiving space and engaged with the positioning member.

9. The socket connector as claimed in claim 8, wherein the positioning member is mounted within a protrusion which is integrally formed from the sidewall and extends inwardly into the receiving space.

10. The socket connector as claimed in claim 9, wherein the protrusion has a slot and the positioning member has an upper end capable of sliding along the slot when the positioning member deforms.

11. The socket connector as claimed in claim 10, wherein the positioning member has a lower end opposite to the upper end and securely retained in the slot.

12. The socket connector as claimed in claim 8, wherein the positioning member extends in a vertical direction.

13. A socket assembly comprising:
   an insulative housing defining an electronic package receiving space therein; and
   a deformable positioning member disposed at a circumferential position of said electronic package receiving space and essentially configured with a simple-support-beam arrangement with regard to the housing and with an engaging section extending into the electronic package receiving space; wherein
   when the electronic package is downwardly loaded into the electronic package receiving space in a vertical direction, the electronic package outwardly pushes the positioning member in a lateral direction perpendicular to said vertical direction, and a displacement of said engaging section along said lateral direction results in a free end of said positioning member to move along the vertical direction.

14. The socket assembly as claimed in claim 13, wherein loading/unloading of said electronic results in a back and forth displacement of said engaging section in said lateral direction and a corresponding back and forth movement of said free end of the positioning member in vertical direction.

15. The socket assembly as claimed in claim 13, wherein said free end is snugly moved along a slot which extends in said vertical direction.

16. The socket assembly as claimed in claim 15, wherein said slot is located in a side wall which surrounds said electronic package receiving space.

17. The socket assembly as claimed in claim 16, wherein said slot is formed in a protrusion unitarily formed with the side wall.

18. The socket assembly as claimed in claim 17, wherein said protrusion is located around a corner.

19. The socket assembly as claimed in claim 13, wherein said positioning member further includes a fixed end opposite to said free end.

20. The socket assembly as claimed in claim 13, wherein said free end is located at a top portion of the positioning member.

* * * * *